United States Patent
Polavarapu

(10) Patent No.: US 6,624,067 B2
(45) Date of Patent: Sep. 23, 2003

(54) PROCESS FOR REMOVING A SILICON-CONTAINING MATERIAL THROUGH USE OF A BYPRODUCT GENERATED DURING FORMATION OF A DIFFUSION BARRIER LAYER

(75) Inventor: Murty S. Polavarapu, Vienna, VA (US)

(73) Assignee: Bae Systems and Information and Electronic Systems Integration Inc., Nashua, NH (US)

(*) Notice: Subject to any disclaimer, the term of this patent is extended or adjusted under 35 U.S.C. 154(b) by 51 days.

(21) Appl. No.: 09/782,533

(22) Filed: Feb. 13, 2001

(65) Prior Publication Data

US 2003/0134501 A1 Jul. 17, 2003

(51) Int. Cl.[7] .......................................... H01L 21/285
(52) U.S. Cl. ....................................... 438/653; 438/719
(58) Field of Search ................. 438/627, 643, 438/653, 719, FOR 355

(56) References Cited

U.S. PATENT DOCUMENTS

| | | | |
|---|---|---|---|
| 4,985,750 A | 1/1991 | Hoshino | 357/71 |
| 5,595,937 A | 1/1997 | Mikagi | 437/192 |
| 5,668,054 A | 9/1997 | Sun et al. | 438/653 |
| 5,888,588 A | * 3/1999 | Nagabushnam et al. | 427/248.1 |
| 5,939,788 A | 8/1999 | McTeer | 257/751 |
| 5,953,634 A | 9/1999 | Kajita et al. | 438/687 |
| 5,968,847 A | * 10/1999 | Ye et al. | 216/67 |
| 5,976,767 A | 11/1999 | Li | 430/313 |

\* cited by examiner

Primary Examiner—George Fourson
(74) Attorney, Agent, or Firm—Dicke, Billig & Czaja, PLLC

(57) ABSTRACT

A process for selectively removing a silicon-containing material through use of a byproduct of a chemical vapor deposition is disclosed. The process includes fabricating an insulating film upon a silicon base layer such that the insulating film includes a cavity. A diffusion barrier layer is deposited into the cavity. The diffusion barrier layer is formed during a chemical vapor deposition which produces an alkyl halide as a byproduct. A photoresist layer is fabricated upon a silicon-containing material. A portion of the photoresist is removed, thereby exposing a portion of the silicon-containing material. The exposed portion of the silicon-containing material is removed with a chemical etch solution including the alkyl halide.

24 Claims, 3 Drawing Sheets

PROCESS FOR REMOVING A SILICON-CONTAINING MATERIAL THROUGH USE OF A BYPRODUCT GENERATED DURING FORMATION OF A DIFFUSION BARRIER LAYER

THE FIELD OF THE INVENTION

The present invention relates generally to the fabrication of semiconductor devices, and more particularly to a process for selectively removing a silicon-containing material through use of an alkyl halide byproduct generated during formation of a conductive material diffusion barrier layer.

BACKGROUND OF THE INVENTION

As the demand for cheaper, faster, low-power consuming microprocessors increases, so must the device packing density of integrated circuits (ICs) used in microprocessors. Very Large Scale Integration (VLSI) and deep submicron Ultra Large Scale Integration (ULSI) techniques have continually evolved to meet the increased demand. Modem ICs are manufactured by an elaborate process in which a large number of electronic semiconductor devices are integrally formed on a semiconductor substrate. Conventional semiconductor devices which are formed on a semiconductor substrate include capacitors, resistors, transistors, diodes, etc.

In advanced manufacturing of ICs, hundreds of thousands of semiconductor devices are formed on a single semiconductor substrate. In order to compactly form the semiconductor devices, the semiconductor devices are formed on varying levels of the semiconductor substrate. This requires forming the semiconductor substrate with a topographical design.

Generally, the fabrication of a semiconductor device includes three steps. First, a silicon wafer is prepared and acts as a foundation for the semiconductor device. Second, the specific semiconductor device is fabricated on top of or within the silicon wafer. Third, the electrical contacts which electrically connect the semiconductor device to external circuitry are fabricated. Each of these three steps further includes various process and fabrication steps.

With respect to the step of preparing a silicon wafer for a semiconductor fabrication, several layers are fabricated on top of the silicon wafer in preparation for the fabrication of the semiconductor device. In one example, an oxide layer, as is known in the art, is fabricated on top of a silicon-based layer. An organic material layer, such as a photoresist layer, is fabricated over the oxide layer. The photoresist layer is then selectively removed to expose one or more portions of the oxide layer. The substrate is then subject to a chemical etch process utilizing a chemical etch solution which selectively removes a portion of the oxide layer in the exposed areas. The remainder of the photoresist layer is then conventionally removed, such as by an "ashing" process in a plasma environment. The process includes the heating of the wafer and use of oxygen gas. Another conventional technique is a wet chemical removal process including dissolving the photoresist layer in a chemical solution containing sulfuric acid and hydrogen peroxide. Alternatively, both processes may be used sequentially (oxygen ash followed by a wet chemical removal). The specific semiconductor device (s) may then be fabricated. A reactive ion etch process is used to define patterns in the oxide layer. Various gaseous mixtures may be used in this process, including, for example, boron trichloride, hydrogen bromide, and chlorine.

With respect to the step of fabricating electrical contacts, aluminum alloys were previously the most commonly used conductive materials. Aluminum has attractive features for use as an electrical connection such as relatively low electrical resistivity and strong adhesion to silicon-containing materials. However, as VLSI dimensions reach into the deep submicron ULSI regime, the deficiency of aluminum and its alloys become limiting factors in achieving superior performance. For example, as the width of electrical interconnections become narrower, the resistance of aluminum becomes non-negligible and begins to contribute significantly to the resistance-capacitance time delay of the device. Additionally, with decreasing dimensions, the design criteria becomes increasingly restricted by reliability concerns associated with aluminum connections such as electromigration, stress-induced formation, and current density limitations.

For these reasons, the industry has recently migrated towards the investigation of more robust, more conductive metals for use in electrical connection technology. Copper is quickly becoming the conductive metal of choice. Copper is approximately 40% lower in resistivity than aluminum and has fewer reliability concerns. In addition, copper provides the desirably conductivity necessary for a proper electrical connection.

A damascene process has been developed to fabricate an electrical connection for use with a VLSI or ULSI circuit. The damascene process includes a chemical vapor deposition (CVD) method for depositing a copper thin film in a developed trench within the oxide film (dielectric layer). However, prior art devices suffer from a deficiency in the deposition of the copper film by means of the CVD method. Specifically, copper atoms are readily diffusable into the adjacent oxide film (dielectric layer) at temperatures required for the formation of the interconnections. The electronic properties of a fabricated semiconductor device are adversely affected by the diffusion of copper into an active region of the semiconductor device. Therefore, in order to prevent the copper atoms from diffusing into an active region of a semiconductor device, a copper diffusion-preventing thin film (a barrier layer) encapsulating the copper wire is required.

Initially, titanium nitride was employed as the barrier layer. However, copper does not properly adhere to titanium nitride. Therefore, the copper film is liable to be stripped away during polishing or thermal treating subsequent to the deposition of the copper film into the titanium nitride barrier layer.

For the reasons stated above, and for other reasons stated below which will become apparent to those skilled in the art upon reading and understanding the present specification, there is a need for a reliable barrier layer which will prevent the diffusion of copper into adjacent oxide or polysilicon layers. A need also exists for the utilization of a byproduct generated during the formation of the barrier layer. Utilizing the byproduct in another process step of the overall fabrication of an IC would greatly increase efficiency and reduce costs of the overall fabrication process.

SUMMARY OF THE INVENTION

The above-mentioned problems with conventional techniques for fabricating a semiconductor device and other problems are addressed by the present invention and will be understood by reading and studying the following specification. A process for selectively removing a silicon-containing material through use of an alkyl halide byproduct formed during fabrication of a barrier layer is disclosed. The barrier layer prohibits diffusion of an electrically connecting material into an adjacent insulating (dielectric) layer.

In particular, an illustrative embodiment of the present invention includes fabricating electrical contacts for interconnecting a first semiconductor device to external circuitry. The fabrication process further includes forming an insulating layer upon a silicon base layer such that the insulating film has a cavity. A diffusion barrier layer is deposited into the cavity. The diffusion barrier layer is formed during a chemical vapor deposition which produces an alkyl halide as a byproduct. An electrically conducting material is deposited into the remaining portion of the cavity. The diffusion barrier layer prevents diffusion of the electrically conducting material into the adjacent insulating layer. The present invention also includes preparing a silicon wafer prior to the formation of a second semiconductor device. The preparation process further includes forming a photoresist layer upon a silicon-containing layer. A portion of the photoresist layer is removed, thereby exposing a portion of the silicon-containing layer. The exposed portion of the silicon-containing layer is removed with a chemical etch solution including the alkyl halide produced during the chemical vapor deposition of the diffusion barrier layer.

In another preferred embodiment, a process of generating an alkyl halide during a fabrication of a first semiconductor device and utilizing the alkyl halide to selectively remove silicon-containing material during the fabrication of a second semiconductor device is disclosed. The process includes fabricating a first semiconductor device which further includes fabricating an insulating layer upon a silicon base layer such that the insulating layer includes a cavity. A diffusion barrier layer is deposited into the cavity. The diffusion barrier layer includes tantalum nitride which is formed during a chemical vapor deposition. The chemical vapor deposition also produces an alkyl halide as a byproduct. An electrically conducting material is deposited into the remaining portion of the cavity. A second semiconductor device is fabricated which further includes fabricating a photoresist layer upon a silicon-containing layer. A portion of the photoresist layer is removed, thereby exposing a portion of the silicon-containing layer. The exposed portion of the polysilicon layer is removed with a chemical etch solution which includes the alkyl halide of the diffusion barrier layer. The present invention provides a novel technique of using previously unused byproducts formed during the fabrication of electrical contacts which connect a semiconductor device to external circuit as a feeder or etching material used in the preparation of a semiconductor wafer prior to formation of a semiconductor device. More specifically, a byproduct formed during the fabrication of a conductive material diffusion barrier layer is stored and used in a subsequent fabrication process. The byproduct is used as a chemical etch solution to remove portions of a silicon-containing material. Therefore, rather than disposing of the byproduct, which can be a costly procedure, a byproduct is stored and utilized in a subsequent fabrication process, thereby reducing cost and increasing efficiency.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
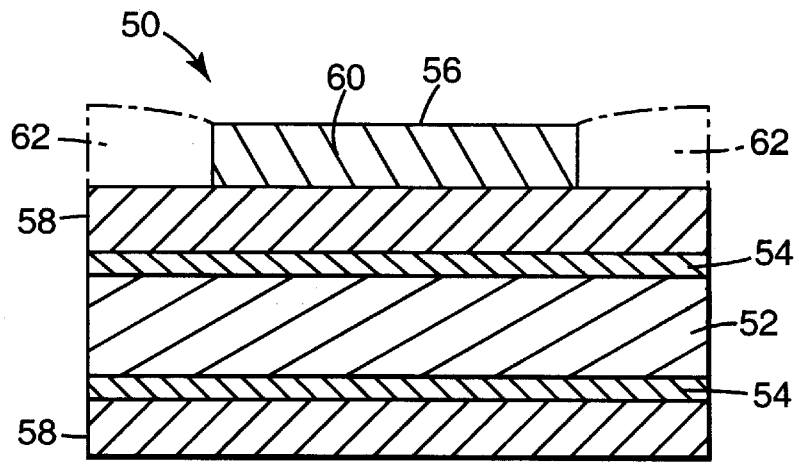
FIGS. 1–3 are sectional views illustrating a process of preparing a silicon wafer prior to formation of a semiconductor device in conjunction with the present invention.
Figure 2:
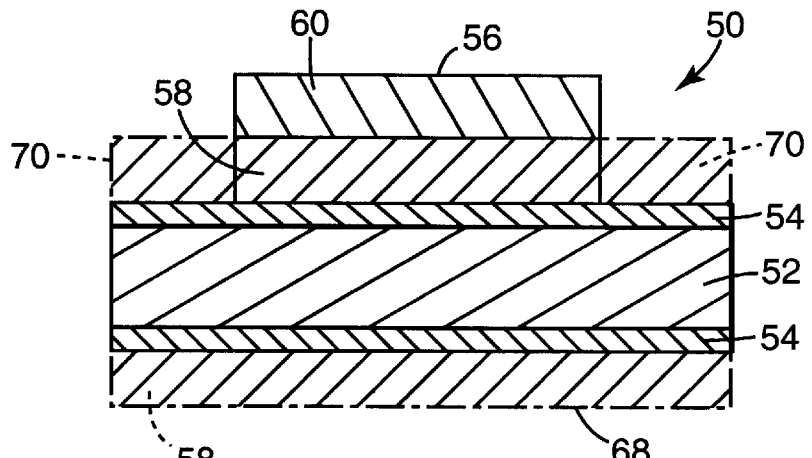
Figure 3:
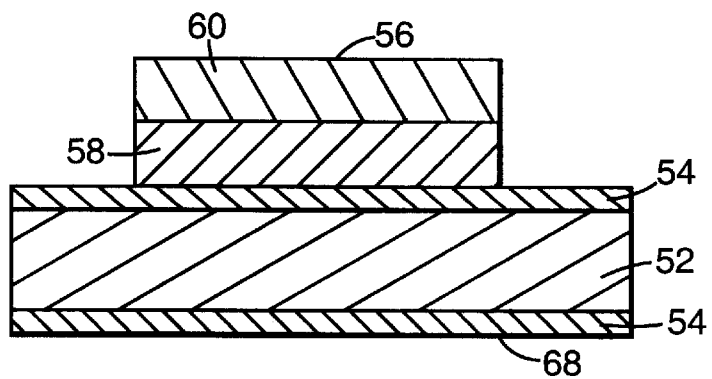

FIGS. 1–3 are cross-sectional views illustrating semiconductor substrate 50. More particularly, FIGS. 1–3 illustrate the formation of patterns composed of polysilicon materials. Semiconductor substrate 50 represents one embodiment of the present invention. As shown in FIG. 1, semiconductor substrate 50 includes silicon base layer 52, which is substantially comprised of polysilicon, monocrystalyne silicon, or amorphous silicon. Oxide layer 54 is a dielectric layer which may be formed over silicon base layer 52 on top side 56. Silicon-containing layer 58 may be fabricated over oxide layer 54, using conventional means. Semiconductor substrate 50 may include various other layers disposed between silicon base layer 52 and silicon-containing layer 58 without varying from the present invention. In one preferred embodiment, silicon-containing layer 58 may substantially comprise polysilicon, monocrystalyne silicon, or amorphous silicon. Further, silicon-containing layer 58 may be comprised of CSG polysilicon or HSG polysilicon.

A layer of organic masking material, such as photoresist layer 60, may be fabricated over silicon-containing layer 58 on side 56. The term organic masking material encompasses polymers and apoxies, and particularly those materials having one or more molecular carbon chains. In addition, the organic masking material may or may not be photosensitive.

Photoresist layer 60 may be selectively removed to expose portions of silicon-containing layer 58 by means known in the art. Portions 62 to be removed are shown in phantom in FIG. 1. As shown in FIG. 2, portion 62 of photoresist layer 60 has been removed, thereby exposing portions 70 of silicon-containing layer 58.

At this point in the fabrication process, semiconductor substrate 50 may be subjected to a chemical etch solution including an alkyl halide combined with hydrogen (H) or helium (He) to selectively remove portions 70 of silicon-containing layer 58 on side 56. In one preferred embodiment, the alkyl halide is bromide (Br), fluorine (F), chlorine (Cl), or iodine (I). Therefore, in one preferred embodiment, the chemical etch solution consist of hydrogen bromide (HBr), hydrogen fluorine (HF), hydrogen chlorine (HCl), hydrogen iodine (HI), helium bromide (HeBr), helium fluorine (HeF), or helium iodine (HeI). Preferably, the chemical etch solution used to remove the exposed portions of silicon-containing layer 58 includes in the range of approximately 5–30% alkyl halide in hydrogen or helium.

The chemical etch solution used to selectively remove portions of silicon-containing layer 58 are generated as a byproduct during the fabrication of tantalum nitride (TaN) used in a future step of the integrated circuit fabrication process disclosed herein. The deposition of tantalum nitride (TaN), as will later be discussed, is accomplished by a chemical vapor deposition reaction wherein a combination of tantalum (Ta) and an alkyl halide reacts with hydrogen (H) and nitrogen (N) to form tantalum nitride (TaN) and a combination of hydrogen (H) and the alkyl halide. The tantalum nitride (TaN) is used as a conductive material diffusion barrier layer, while the combination of hydrogen (H) and the alkyl halide is a toxic byproduct. In prior art processes, this toxic byproduct is disposed. Great care must be taken and cost is incurred to dispose the toxic byproduct, greatly increasing the overall production cost. However, the present invention utilizes the hydrogen and alkyl halide byproduct as a chemical etch solution to remove portions 70 of silicon-containing layer 58. In the interim between generating the alkyl halide byproduct during the fabrication of a first semiconductor device and the utilization of the alkyl halide byproduct during the fabrication of a second semiconductor device, the byproduct may be properly stored by means known in the art.

FIG. 3 is a cross-sectional view showing semiconductor substrate 50 after portions 70 of silicon-containing layer 58 on side 56 have been removed by the chemical etch solution which includes the alkyl halide. At this point, the foundation of the semiconductor device is complete and ready for fabrication of the actual semiconductor device.

Figure 4:
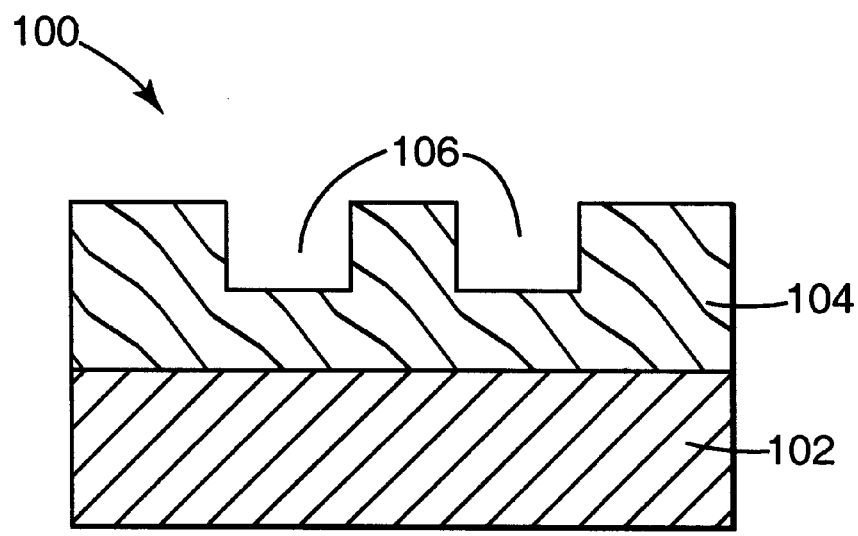
FIGS. 4–7 are sectional views illustrating the fabrication of a semiconductor device and its associated electrical contacts in conjunction with the present invention.
Figure 5:
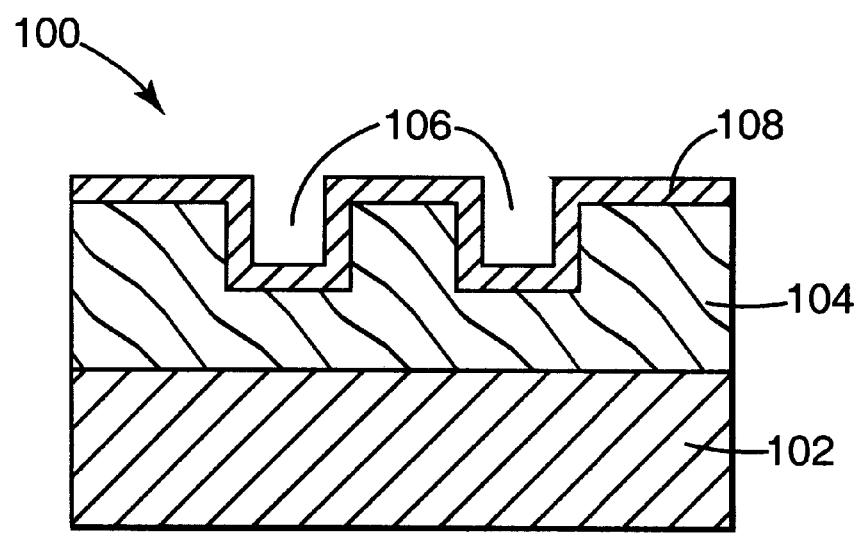
Figure 6:
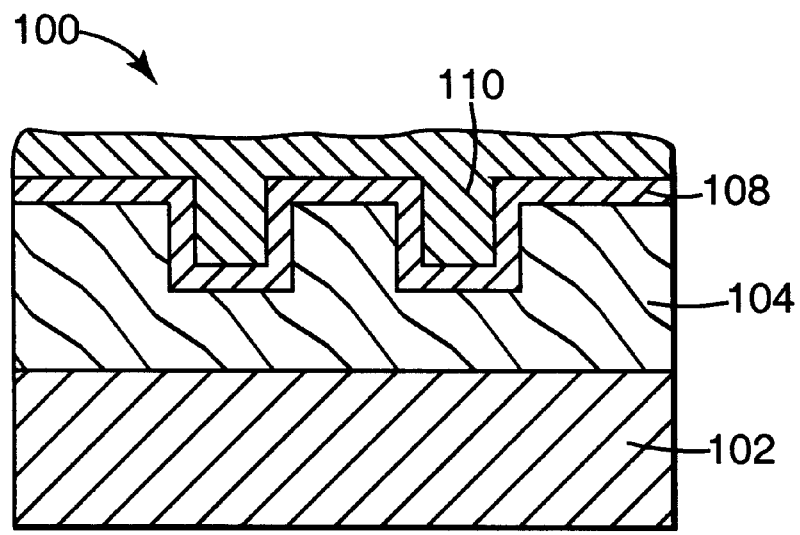

FIGS. 4–6 disclose various cross-sectional views which illustrate the fabrication of a portion of a semiconductor device in conjunction with the present invention. More particularly, FIGS. 4–6 illustrate the formation of interconnections between semiconductor devices utilizing a barrier layer and an electrically conducting material, such as copper or aluminum. Semiconductor device 100 includes silicon substrate 102. Silicon substrate 102 comprises various layers and elements previously described with reference to FIGS. 1–3. In particular, silicon substrate 102 includes various transistors and contacts. Silicon oxide layer 104 is fabricated on top of silicon substrate 102 through one of various means known in the art. Silicon oxide layer 104 substantially comprises an intermetal dielectrical material selected from the group comprising silicon oxide, silicon dioxide, borphosphosilicata glass (BPSG), borosilicate glass (BSG), and phosphosilicate glass (PSG). Cavities or contact holes 106 are defined in silicon oxide layer 104 via conventional techniques.

As shown in FIG. 5, diffusion barrier layer 108 is deposited on top of silicon oxide layer 104 and within contact holes 106. The purpose of diffusion barrier layer 108 is to prevent electrically conducting material (contacts 110 shown in FIGS. 6 and 7) from diffusing into silicon oxide layer 104. Without diffusion barrier layer 108, electrically conducting material forming contacts 110 will diffuse into adjacent layers or elements during an elevated temperature process necessary to properly fabricate contacts 110.

In one preferred embodiment, electrically conducting diffusion barrier layer 108 is tantalum nitride (TaN). One method of depositing tantalum nitride is through use of a chemical vapor deposition process of reacting a combination of tantalum (Ta) and an alkyl halide with hydrogen (H) and nitrogen (N) or with helium (He) and nitrogen (N). This yields tantalum nitride (TaN) and a combination of the alkyl halide and hydrogen (H) or helium (He). The combination of the alkyl halide and hydrogen (H) or helium (He) is highly toxic and hazardous. In prior art fabrication process, as previously discussed, the combination of the hydrogen or helium and the alkyl halide was disposed. Extreme caution is necessary during this process. The disposal process adds significant unwanted costs to prior art fabrication process.

In one preferred embodiment, the alkyl halide is bromide (Br), fluorine (F), chlorine (Cl), or iodine (I). Therefore, the chemical etch solution consists of hydrogen bromide (HBr), hydrogen fluorine (HF), hydrogen chlorine (HCl), hydrogen iodine (HI), helium bromide (HeBr), helium fluorine (HeF), helium chlorine (HeCl), or helium iodine (HeI). Preferably, the alkyl halide byproduct includes in the range of approximately 5–30% alkyl halide in hydrogen or helium.

The hydrogen or helium and the alkyl halide byproduct is purified by a scale-down purification process that is used in commercial production of a hydrogen or helium and alkyl halide combination known in the art. The combination is stored at appropriate temperatures known in the art and is used on a future semiconductor substrate as a chemical etch solution to selectively remove portions of a silicon-containing material, as previously discussed with reference to FIG. 3.

Figure 7:
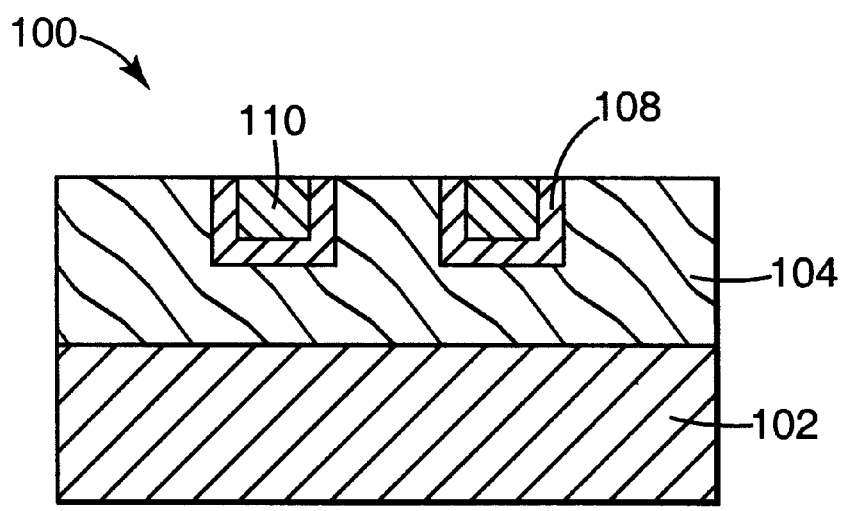

Referring now to FIG. 6, once diffusion barrier layer 108 is deposited on top of silicon oxide layer 104 and within contact hole 106, electrically conducting material 110 is deposited within contact holes (cavity) 106. As shown in FIG. 7, the top surfaces of diffusion barrier layer 108 above silicon oxide layer 104 and electrically conducting material 110 within contact holes 106 are then removed using conventional means, such as a planarization process. Electrically conducting material 110 may be connected to external circuitry not shown in FIG. 7 for clarity purposes. In one preferred embodiment, electrically conducting material 110 is fabricated from either a copper-containing material or an aluminum-containing material.

Aluminum has attractive features for use as an electrical connection such as relatively low electrical resistivity and strong adhesion to silicon dioxide. However, as very large scale integration (VLSI) dimensions reach into the deep submicron ultra large scale integration (ULSI) regime, the deficiencies of aluminum become limiting factors in achieving superior performance. For example, as the width of electrical interconnections become narrower, the resistance of aluminum becomes non-negligible and begins to contribute significantly to the resistance-capacitance time delay of the device. Additionally, with decreasing dimensions, the design criterion becomes increasingly restricted by reliability concerns associated with aluminum connections such as electromigration, stress-induced formation, and current density limitations. Therefore, copper is often used for the fabrication of electrical contacts for connection to external circuitry. Both aluminum and copper atoms readily diffuse into insulating layer 104 at temperatures required for the formation of the interconnections without the inclusion of diffusion barrier layer 108 as previously described.

The present invention provides a novel technique of using previously unused byproducts formed during the fabrication of one portion of a first semiconductor device as a feeder or etching material used in the fabrication of a distinct process of a second semiconductor device. More specifically, a byproduct formed during the fabrication of a conductive material diffusion barrier layer is stored and used in a subsequent fabrication process as a chemical etch solution to remove portions of a silicon-containing material. Therefore, rather than disposing of the byproduct, which can be a costly procedure, the byproduct is stored and utilized in a subsequent fabrication process, thereby reducing costs and increasing efficiency.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A process for fabricating semiconductor devices comprising:
    fabricating an insulating film having a cavity;
    depositing a diffusion barrier layer into the cavity of the insulating layer, the diffusion barrier layer formed during a chemical vapor deposition, producing an alkyl halide as a byproduct; and
    removing an exposed portion of a silicon-containing layer with a chemical etch solution including the alkyl halide.

2. The process of claim 1, wherein removing the exposed portion of the silicon-containing layer with a chemical etch solution including the alkyl halide further comprises:
    removing the exposed portion of the silicon-containing layer with a chemical etch solution including at least one of the alkyl halides selected from the group of alkyl halides consisting of bromide, fluorine, chlorine, and iodine.

3. The process of claim 1, wherein removing the exposed portion of the silicon-containing layer with a chemical etch solution including the alkyl halide further comprises:
    removing the exposed portion of the silicon-containing layer with a chemical etch solution consisting of 5–30% of the alkyl halide in hydrogen.

4. The process of claim 1, wherein removing the exposed portion of the silicon-containing layer with a chemical etch solution including the alkyl halide further comprises:
    removing the exposed portion of the silicon-containing layer with a chemical etch solution consisting of 5–30% of the alkyl halide in helium.

5. The process of claim 1, wherein removing the exposed portion of the silicon-containing layer with a chemical etch solution including the alkyl halide further comprises:
    removing the exposed portion of the silicon-containing layer with a chemical etch solution consisting of 5–30% of the alkyl halide in helium.

6. The process of claim 1, wherein depositing the diffusion barrier layer into the cavity further comprises:
    depositing a diffusion barrier layer of tantalum nitride into the cavity.

7. The process of claim 1, and further comprising:
    depositing an electrically conducting material upon the diffusion barrier layer in the cavity.

8. The process of claim 6, wherein depositing an electrically conducting material further comprises:
    depositing a copper-containing material to fill the cavity.

9. The process of claim 6, wherein depositing an electrically conducting material further comprises:
    depositing an aluminum-containing material to fill the cavity.

10. The process of claim 1, wherein the step of removing an exposed portion of a silicon-containing layer further comprises:
    fabricating a photoresist layer upon a silicon-containing layer;
    removing a portion of the photoresist layer, thereby exposing a portion of the silicon-containing layer; and
    removing the exposed portion of the silicon-containing layer with a chemical etch solution including the alkyl halide.

11. A process of generating an alkyl halide during the fabrication of a first semiconductor device and utilizing the alkyl halide to selectively remove a silicon-containing material during the fabrication of a second semiconductor device, the process comprising:
    fabricating a first semiconductor device further comprising:
        depositing a diffusion barrier layer into a cavity in an insulated film fabricated upon a silicon base layer, the tantalum nitride formed during a chemical vapor deposition which produces an alkyl halide as a byproduct;
    fabricating a second semiconductor device further comprising:
        removing an exposed portion of a silicon-containing layer with a chemical etch solution including the alkyl halide.

12. The process of claim 10, wherein removing the exposed portion of the silicon-containing layer with the chemical etch solution including the alkyl halide further comprises:
    removing the exposed portion of the silicon-containing layer with a chemical etch solution including at least one of the alkyl halides selected from the group of alkyl halides consisting of bromide, fluorine, chlorine, and iodine.

13. The process of claim 10, wherein removing the exposed portion of the silicon-containing layer with the chemical etch solution including the alkyl halide further comprises:
    removing the exposed portion of the silicon-containing layer with a chemical etch solution consisting of 5–30% of the alkyl halide in hydrogen.

14. The process of claim 10, wherein removing the exposed portion of the silicon-containing layer with the chemical etch solution including the alkyl halide further comprises:
    removing the exposed portion of the silicon-containing layer with a chemical etch solution consisting of 5–30% of the alkyl halide in helium.

15. The process of claim 10, wherein removing the exposed portion of the silicon-containing layer with the chemical etch solution including the alkyl halide further comprises:
    removing the exposed portion of the silicon-containing layer with a chemical etch solution consisting of 5–10% of the alkyl halide in helium.

16. The process of claim 10, wherein depositing the diffusion barrier layer into the cavity further comprises:
    depositing a diffusion barrier layer of tantalum nitride into the cavity.

17. The process of claim 10, wherein fabricating a first semiconductor device further comprises:
    depositing an electrically conducting material in the cavity.

18. The process of claim 15, wherein fabricating a second semiconductor device further comprises:
    fabricating a photoresist layer upon a silicon-containing layer; and
    removing a portion of the photoresist layer, thereby exposing the portion of the silicon-containing layer.

19. The process of claim 15, wherein depositing the electrically conducting material further comprises:
    depositing a copper-containing material to fill the cavity.

20. The process of claim 15, wherein depositing the electrically conducting material further comprises:

depositing an aluminum-containing material to fill the cavity.

21. A process for selectively removing a silicon-containing material through use of an alkyl halide byproduct formed during formation of tantalum nitride used as a diffusion barrier layer, the process comprising:

fabricating a photoresist layer upon a silicon-containing material;

removing a portion of the photoresist layer, thereby exposing a portion of the silicon-containing material; and removing the exposed portion of the silicon-containing material with a chemical etch solution including the alkyl halide byproduct.

22. The process of claim 19, wherein removing the exposed portion of the silicon-containing layer with the chemical etch solution including the alkyl halide further comprises:

removing the exposed portion of the silicon-containing layer with a chemical etch solution including at least one of the alkyl halides selected from the group of alkyl halides consisting of bromide, fluorine, chlorine, and iodine.

23. The process of claim 19, wherein removing the exposed portion of the silicon-containing layer with the chemical etch solution including the alkyl halide further comprises:

removing the exposed portion of the silicon-containing layer with a chemical etch solution consisting of 5–30% of the alkyl halide in hydrogen.

24. The process of claim 19, wherein removing the exposed portion of the silicon-containing layer with the chemical etch solution including the alkyl halide further comprises:

removing the exposed portion of the silicon-containing layer with a chemical etch solution consisting of 5–30% of the alkyl halide in helium.

* * * * *

UNITED STATES PATENT AND TRADEMARK OFFICE
CERTIFICATE OF CORRECTION

PATENT NO. : 6,624,067 B2
DATED : September 23, 2003
INVENTOR(S) : Murty S. Polavarapu It is certified that error appears in the above-identified patent and that said Letters Patent is hereby corrected as shown below:

Column 1,
Line 13, delete "conductive" and insert -- conducive -- therefor.
Line 21, delete "Modem" and insert -- Modern -- therefor.

Column 4,
Lines 15 and 24, delete "monocrystalyne" and insert -- monocrystalline -- therefor.
Line 30, delete "apoxies" and insert -- epoxies -- therefor.

Column 5,
Line 31, delete "borphosphosilicata" and insert -- borophosphosilicate -- therefor.

Column 7,
Lines 49 and 52, delete "claim 6" and insert -- claim 7 -- therefor.

Column 8,
Lines 17, 26, 34, 41, 48 and 52, delete "claim 10" and insert -- claim 11 -- therefor.
Line 57, delete "claim 15" and insert -- claim 11 -- therefor.
Lines 63 and 66, delete "claim 15" and insert -- claim 17 -- therefor.

Column 9,
Line 16, delete "claim 19" and insert -- claim 21 -- therefor.

Column 10,
Lines 4 and 12, delete "claim 19" and insert -- claim 21 -- therefor.

Signed and Sealed this

Fifteenth Day of November, 2005

JON W. DUDAS
*Director of the United States Patent and Trademark Office*